(12) United States Patent
Tanase

(10) Patent No.: US 9,093,992 B1
(45) Date of Patent: Jul. 28, 2015

(54) CURRENT-BOOSTING OUTPUT STAGE WITH SHORT-CIRCUIT PROTECTION

(71) Applicant: Maxim Integrated Products, Inc., San Jose, CA (US)

(72) Inventor: Gabriel E. Tanase, Cupertino, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/328,594

(22) Filed: Jul. 10, 2014

Related U.S. Application Data

(60) Provisional application No. 61/932,184, filed on Jan. 27, 2014.

(51) Int. Cl.
*H03K 3/00* (2006.01)
*H03K 5/02* (2006.01)
*H03F 1/02* (2006.01)

(52) U.S. Cl.
CPC .............. *H03K 5/023* (2013.01); *H03F 1/0261* (2013.01)

(58) Field of Classification Search
USPC .......................................................... 327/108
See application file for complete search history.

(56) References Cited

U.S. PATENT DOCUMENTS 5,572,166 A * 11/1996 Gilbert ........................... 330/254
2009/0153249 A1* 6/2009 Kimura ......................... 330/264

* cited by examiner

*Primary Examiner* — Lincoln Donovan
*Assistant Examiner* — Patrick Chen
(74) *Attorney, Agent, or Firm* — TIPS Group

(57) ABSTRACT

A circuit is provided for both boosting output current and providing short circuit protection in an integrated circuit such as an operational amplifier. In an embodiment, a current-boosting output stage with short-circuit protection includes six current sources and six transistors, where the the boosting of output current is achieved using positive feedback and the short circuit protection is achieved using negative feedback.

16 Claims, 2 Drawing Sheets

CURRENT-BOOSTING OUTPUT STAGE WITH SHORT-CIRCUIT PROTECTION

CROSS REFERENCE TO RELATED APPLICATION(S)

This application claims the benefit of U.S. Provisional Patent Application Ser. No. 61/932,184, filed Jan. 27, 2014, which is incorporated herein by reference.

BACKGROUND

An operational amplifier ("op-amp") is a direct current (DC) coupled high-gain electronic voltage amplifier with a differential input. An op-amp produces an output potential (relative to circuit ground) that is much greater than the potential between its differential input terminals. Op-amps are among the most widely used electronic devices today, being used in a vast array of consumer, industrial, and scientific devices. Op-amps may be packaged as components, or used as elements of more complex integrated circuits (ICs).

It is sometimes desirable to increase the maximum current provided by an op-amp's output stage to accommodate heavier loads. In the prior art, this has been accomplished by providing "current-boosting" circuits to improving the output stage current. The downside associated with such solutions is that they limit the frequency domain performance of the op-amp. Also, output stages with high current capability may require short circuit protection. Such circuit solutions are generally provided as a separate circuit and need to work properly in conjunction with the current-boosting circuits, which adds complexity and costs to the system.

These and other limitations of the prior art will become apparent to those of skill in the art upon a reading of the following descriptions and a study of the several figures of the drawing.

SUMMARY

In an embodiment, set forth by way of example and not limitation, a method and circuit is provided for both boosting output current and short circuit protection in an integrated circuit. In an example embodiment, the boosting of output current is achieved using positive feedback and the short circuit protection is achieved using negative feedback.

In an embodiment, set forth by way of example and not limitation, a current-boosting output stage with short-circuit protection includes six current sources and six transistors. In this example, a first current source has a first current source output, a second current source has a second current source output, a third current source has an input coupled to the second current source output and has a third current source output, a fourth current source has an input coupled to the first current source output and has a fourth current source output, a fifth current source has an input coupled to the third current source output and has a fourth current source output, and a sixth current source has an input coupled to the fourth current source output. Also in this example, a first transistor is coupled to the fifth current source output and has a first base is coupled to an input node, a second transistor is coupled to the sixth current source output and has a second base is coupled to the input node, a third transistor that is coupled to and smaller than the first transistor and has a third base is coupled to the fifth current source output, a fourth transistor that is coupled to and smaller than the second transistor and has a fourth base is coupled to the sixth current source output, a fifth transistor that is larger than the third transistor and has a fifth base is coupled to the fifth current source output; and a sixth transistor that is larger than the fourth transistor and has a sixth base is coupled to the sixth current source output. In certain example embodiments, the first current source and the second current source are fixed current sources and the third current source, the fourth current source, the fifth current source and the sixth current source are variable current sources.

An advantage of certain example embodiments is that an op-amp can achieve high-speed AC performance while exhibiting a low quiescent current by providing both current-boosting and short circuit protection.

Another advantage of certain example embodiments is that the circuit is protected against short circuits to positive or negative power supply levels.

A still further advantage of certain example embodiments is that the circuit and method have a negligible impact upon the AC performance and stability of an op-amp.

These and other embodiments, features and advantages will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures.

DETAILED DESCRIPTION OF EXAMPLE EMBODIMENTS

Figure 1:
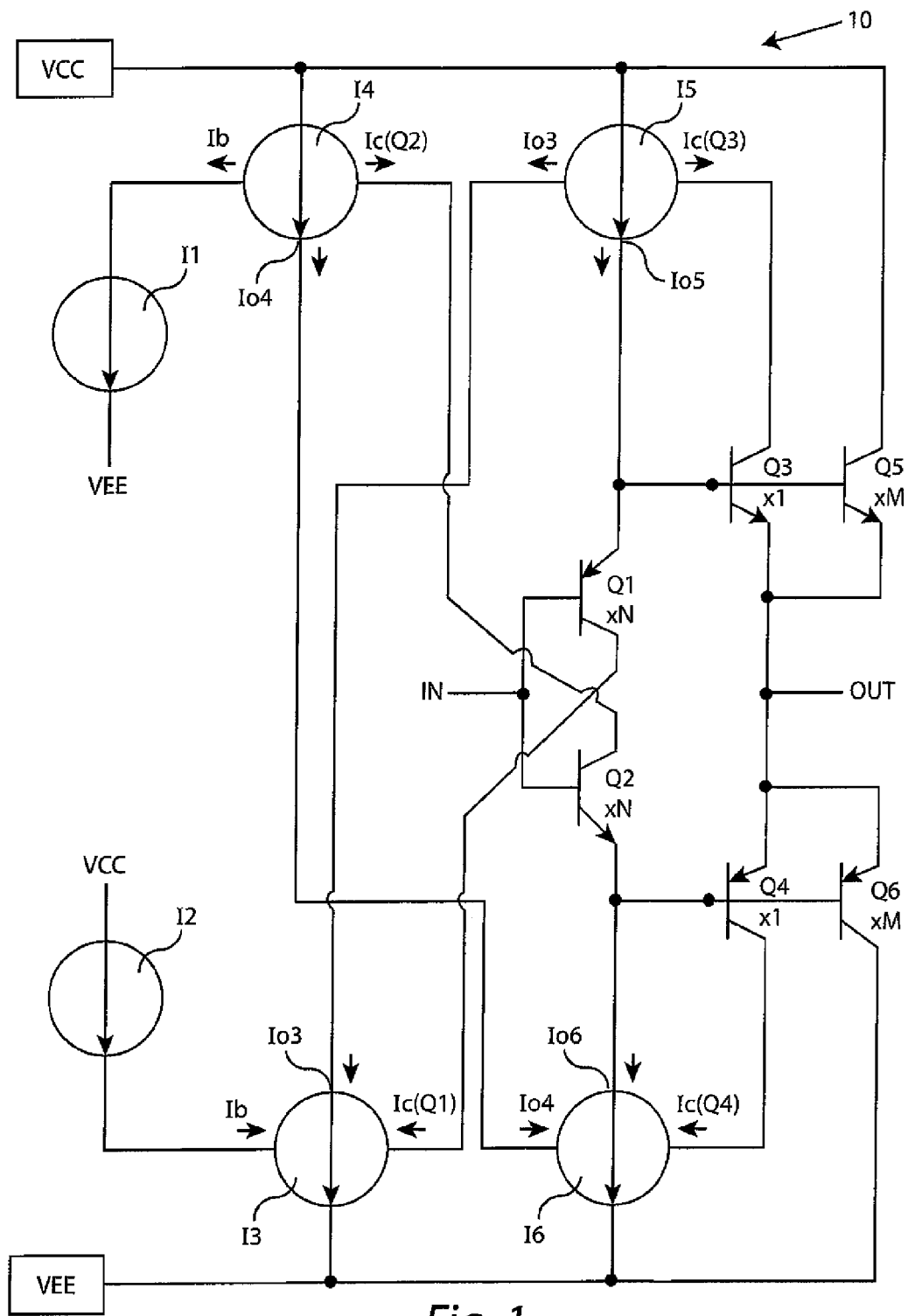
FIG. 1 is a block diagram of an example current-boosting output stage with short-circuit protection.

In FIG. 1, a block diagram of a current boosting output stage 10 with short-circuit protection is illustrated by way of example and not limitation. In this example, an input signal is applied to node IN and the output signal is developed on a node OUT. In operation, a load (not shown) is coupled to the node OUT. For example, the load can be a resistive load.

Example output stage 10 includes six current sources I1, I2, I3, I4, I5 and I6. Current sources I1 and I2 are fixed and each has one input and one output. Current sources I3, I4, I5 and I6 are variable, and each includes three inputs and one output. The outputs for current sources I3, I4, I5 and I6 are labeled Io3, Io4, Io5 and Io6, respectively, and their designations as outputs are irrespective of current flow direction. Likewise, the designation of the three "inputs" of each of the current sources I3, I4, I5 and I6 is irrespective as to the direction of current flow.

Transistors Q1, Q2, Q5 and Q6 are arranged as a "diamond buffer" configuration, which is well known to those of skill in the art. In alternate embodiments, other configurations can be used. The bases of transistors Q3 and Q5 are coupled to the emitter of transistor Q1 and the bases of transistors Q4 and Q6 are coupled to the emitter of transistor Q2. Using transistors Q3 and Q4 to represent a unit value (e.g. a unit area for the transistors), transistors Q5 and Q6 have an associated multiplier M and transistors Q1 and Q2 have an associated multiplier N, where M is generally greater is greater than N. VCC is the positive power supply and VEE is the negative power supply (or ground in this example). In other embodiments additional voltage levels may be employed.

In this example embodiment, the output current is boosted using dynamic biasing. That is, in this non-limiting example, the controlled current sources I5 and I6 are designed to provide more current for driving transistors Q5 or Q6 in response to an increased output current required by a load connected to OUT. This feature is implemented providing current gain factors "m" and "p" for current sources I3, I4, I5 and I6. Limited feedback is used such that "m" and "p" will increase when I(OUT) increases.

In this non-limiting example embodiment, the output Io3, Io4, Io5 and Io6 of currents sources I3, I4, I5 and I6, respectively, can be calculated as follows (where "·" designates multiplication):

$$Io3 = m \cdot Ib - Ic(Q1) \quad \text{Equation A}$$

$$Io4 = m \cdot Ib - Ic(Q2) \quad \text{Equation B}$$

$$Io5 = p \cdot Io3 - Ic(Q3) \quad \text{Equation C}$$

$$Io6 = p \cdot Io4 - Ic(Q4) \quad \text{Equation D}$$

In this non-limiting example, the I1 and I2 current sources generate a fixed bias current (Ib) applied at the input of the controlled current sources I4 and I3, respectively. Next, I4 and I3 output currents (Io4 and Io3) are applied at the inputs of I6 and I5 controlled current sources. Based on the current-law equations the following equations are derived:

$$Ie(Q2) + Ib(Q4) + Ib(Q6) = p \cdot [m \cdot Ib - Ic(Q2)] - Ic(Q4) \quad \text{Equation 1}$$

$$Ie(Q1) + Ib(Q3) + Ib(Q5) = p \cdot [m \cdot Ib - Ic(Q1)] - Ic(Q3) \quad \text{Equation 2}$$

It is possible to approximate $Ie(Q2) \approx Ic(Q2)$ and $Ie(Q1) \approx Ic(Q1)$ since the base currents of Q1 and Q2 are negligible. Using these approximations and Equations 1 and 2, the following equations are derived:

$$(1+p) \cdot Ic(Q2) = m \cdot p \cdot Ib - Ic(Q6) \cdot (M + \beta_6 + 1)/(M \cdot \beta_6) \quad \text{Equation 3}$$

$$(1+p) \cdot Ic(Q1) = m \cdot p \cdot Ib - Ic(Q5) \cdot (M + \beta_5 + 1)/(M \cdot \beta_5) \quad \text{Equation 4}$$

In dynamic operation, Ic(Q2) and/or Ic(Q1) can decrease to be close to zero (0). Using Equations 3 and 4, the following maximum values for Ic(Q6) and/or Ic(Q5) are derived:

$$Ic(Q6)\max = Ib \cdot m \cdot p \cdot M \cdot \beta_6/(M + \beta_6 + 1) \quad \text{Equation 5}$$

$$Ic(Q5)\max = Ib \cdot m \cdot p \cdot M \cdot \beta_5/(M + \beta_5 + 1) \quad \text{Equation 6}$$

In this non-limiting example, a value of M is chosen such that $M < \beta_6$, $M < \beta_5$ and, using Equations 5 and 6, the following equation is derived:

$$Ic(Q6)\max = Ic(Q5)\max = Ib \cdot m \cdot p \cdot M \quad \text{Equation 7}$$

Equation 7, above, provides the value of the output current when OUT is shorted to VCC or VEE. Therefore, short-circuit protection is achieved through the feedback path provided by Q3 and Q4. These devices return 1/M fraction of Q5 and Q6 collector currents.

Without Q3 and Q4, the short-circuit currents would have been limited by Q5 and Q6 current gain parameters, $\beta_5$ and $\beta_6$, $Ic(Q6)\max = Ib \cdot m \cdot p \cdot \beta_6$ and $Ic(Q5)\max = Ib \cdot m \cdot p \cdot \beta_5$. However, the values of parameters $\beta_5$ and $\beta_6$ are process dependent. Advantageously, in this non-limiting example, the use of feedback provided by Q3 and Q4 result in the short-circuit currents becoming significantly less process dependent, as shown by Equation 7.

It will be appreciated that the output stage apparatus 10 and the method embodied therein provides enhanced output current capability with a lower quiescent current, e.g. the current drawn from the circuit when it is not amplifying a signal or driving a load. Variable current sources I5 and I6 dynamically provide additional current while protecting against shorting. For example, when the input voltage at node IN increases the currents provided by current sources I5 and I6 also increases. As the output current increases, the base currents of the driving transistors increase as well. For example, if the current into transistor pair Q3/Q5 increases as current through Q5 to the load attached to node OUT increases, there is less current going to transistor Q1, such that current source I3 current Ic(Q1) will decrease, increasing the I3 current Io3. This draws current from current source I5 so the Io5 output current will increase (positive feedback).

It will be noted that variable current sources I3 and I4 include the multiplier "m" and variable current sources I5 and I6 include the multiplier "p". The multiplier m is generally a linear function and the multiplier p is generally a non-linear function. Both multipliers m and p can be "built in" to the circuitry of the current sources. These multipliers enable the feedback to the variable current sources, but must be relatively small to maintain the stability of the circuit. The positive feedback to variable current sources I3 and I4 is considered to be linear in the frequency domain and the positive feedback to the variable current sources I5 and I6 are considered to be non-linear in the time (transient) domain.

Figure 2:
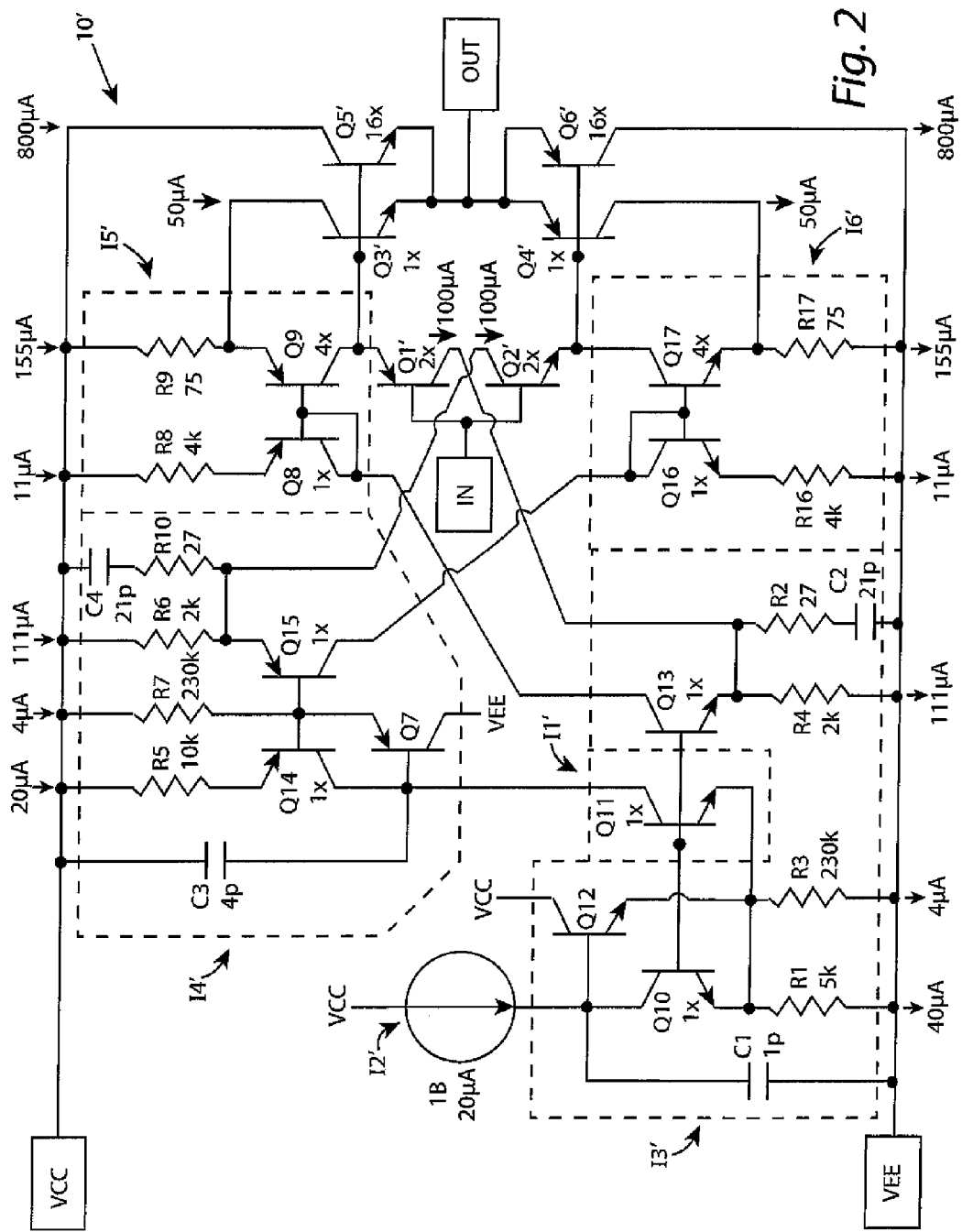
FIG. 2 is a schematic diagram of the example output stage of FIG. 1.

In FIG. 2, a schematic diagram of an output stage 10' is illustrated by way of example and not limitation. It should be noted that the parameters of the example circuit are also set forth by way of example and not limitation, in that other component values, currents, and voltages can be employed in alternate embodiments. In this example embodiment, like components and circuits will be given like reference numbers.

Example output stage 10' includes six current sources I1', I2', I3', I4', I5' and I6'. Current sources I1' and I2' are fixed and each has one input and one output. Current sources I3', I4', I5' and I6' are variable, as was with the example output stage 10 of FIG. 1. Transistors Q1' and Q2' are configured as a diamond buffer. The bases of transistors Q3' and Q5' are coupled to the emitter of transistor Q1' and the bases of transistors Q4' and Q6' are coupled to the emitter of transistor Q2'. Using transistors Q3' and Q4' to represent a unit value (e.g. a unit area for the transistors), transistors Q5' and Q6' have an associated multiplier M=16, in this non-limiting example, and transistors Q1' and Q2' have an associated multiplier N=2, in this non-limiting example. The N=2 and M=16 were chosen in this example embodiment for the purposes of distortion reduction and AC performance optimization. VCC is the positive power supply and VEE is the negative power supply (or ground in this example). In other embodiments additional voltage levels may be employed.

In this non-limiting example, "dynamic biasing" is employed for output current boosting and short-circuit protection. In this non-limiting example, current mirrors comprising transistor pair Q14/Q15 and transistor pair Q10/Q13, have a current-gain factor "m". The current mirrors Q8/Q9 and Q16/Q17 have a current-gain factor "p".

A large output current change (either positive or negative) will "kick-in" the current boosting circuitry. In the situation when the output (OUT) is "sourcing" current (e.g. when there is a short circuit to VEE), the current is provided by transistors Q5' and Q3'. Under such conditions, the collector current of transistor Q1' will decrease as the base currents of transistors Q3' and Q5' increase. This results in an increased collector current of transistor Q13 since the total current through resistor R4 is roughly constant. The increased collector current of transistor Q13 results in an increased collector current of transistor Q9 and will provide additional base current for transistors Q5' and Q3'.

It should be noted that the example dynamic current boosting circuit and method is self-limiting for both "sourcing" and "sinking" short circuits. As used herein, the convention "Ic(QX)" means the collector current of transistor QX, "Ie(QX)" means the emitter current of transistor QX, and "Ib(QX)" means the base current of transistor QX.

In the case of a "sourcing" short-circuit, the current Ic(Q1) ≈0 since most of Ic(Q9) flows into the base of Q3' and Q5'. In this situation, Ic(Q13) will reach its maximum value (e.g. ≈90 µA in this non-limiting example). This current is fed into the current mirror of transistor pair Q8/Q9. The current through resistor R9 reaches its maximum value (e.g. ≈4.8 mA in this non-limiting example). This current will split between Ic(Q3') and Ic(Q9). Most of the I(R9) current goes to Ie(Q3') and Ib(Q5'). For simplicity, it can be assumed that Ie(Q3')≈I(R9), where β>>16. Therefore, I (OUT) max sourcing-current short-circuit condition can be calculated to be ≈(16+1)*4.8 mA=81.6 mA, in this non-limiting example.

In the situation when the output (OUT) is "sinking" current (e.g. a short to VCC), the current is provided by transistors Q6' and Q4'. The collector current of transistor Q2' will decrease as the base currents of transistors Q4' and Q6' increase which results in increased an collector current for transistor Q15 since total current through resistor R6 is roughly constant. The increased collector current of transistor Q15 will yield an increased collector current of transistor Q17, thereby providing more base current for Q6' and Q4'. It can be approximated that the current Ic(Q2')≈0, since most of current Ic(Q17) flows into the base of Q4' and Q6' as noted above, such that the current Ic(Q15) will reach its maximum value (e.g. ≈90 µA in this non-limiting example). This current is fed into the current mirror of transistors Q16/Q17 such that the current through resistor R17 reaches its maximum value (e.g. ≈4.8 mA in this non-limiting example). This current splits into Ic(Q4') and Ic(Q17), where most of Ic(R17) current goes to Ie(Q4') and Ib(Q6'). Using the approximation Ie(Q4')≈I(R17), where β>>16 creates an I (OUT) maximum sinking-current short-circuit condition of about ≈(16+1)*4.8 mA=81.6 mA, in this non-limiting example.

It should be noted that the m and p multipliers as described previously are defined by the components and circuitry of the variable current sources in this non-limiting example. For example, the voltages across resistors R1 and R5 of variable current sources I3' and I4' are about 200 millivolts in this example, which is much larger that the thermal voltage of semiconductors of (about 25 or 26 millivolts at ambient temperatures). Therefore, the current mirrors of current sources I3 and I4 act substantially linearly and the m multiplier is almost a constant value. In contrast, the voltages across resistors R8 and R16 of the variable current sources I5' and I6' are only about 44 millivolts, which is near the thermal voltage, resulting in non-linear operation as represented by a non-linear p multiplier.

It should be noted that transistors Q3' and Q4' operate within the non-linear I5' and I6' current range to both provide current boosting and shorting protection for a load coupled to the output OUT. For example, if OUT is shorted and at the output current is at its maximum, the current of transistor Q3' is a fraction of the current of output current Q5' and provides feedback to the current sources to limit the current provided to output transistor Q5'.

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A current-boosting output stage with short-circuit protection comprising:
    a first current source having a first current source output;
    a second current source having a second current source output;
    a third current source having an input coupled to the second current source output and having a third current source output;
    a fourth current source having an input coupled to the first current source output and having a fourth current source output;
    a fifth current source having an input coupled to the third current source output and having a fifth current source output;
    a sixth current source having an input coupled to the fourth current source output;
    a first transistor coupled to the fifth current source output and having a first base coupled to an input node;
    a second transistor coupled to the sixth current source output and having a second base coupled to the input node;
    a third transistor that is coupled to and smaller than the first transistor and having a third base coupled to the fifth current source output;
    a fourth transistor that is coupled to and smaller than the second transistor and having a fourth base coupled to the sixth current source output;
    a fifth transistor that is larger than the third transistor and having a fifth base coupled to the fifth current source output; and
    a sixth transistor that is larger than the fourth transistor and having a sixth base coupled to the sixth current source output;
    wherein the fifth transistor is larger than the first transistor and the sixth transistor is larger than the second transistor;
    wherein the third transistor and the fifth transistor comprise a first mirrored transistor pair coupled to an output node and the fourth transistor and the sixth transistor comprise a second mirrored transistor pair coupled to the output node; and
    wherein the first transistor, the second transistor, the third transistor, the fourth transistor, the fifth transistor and the sixth transistor are arranged in a diamond-buffer configuration.

2. A current-boosting output stage with short-circuit protection as recited in claim 1 wherein an emitter of each of the third transistor, the fourth transistor, the fifth transistor and the sixth transistor is coupled to the output node.

3. A current-boosting output stage with short-circuit protection as recited in claim 1 wherein the third transistor and the fifth transistor are of a first polarity and the fourth transistor and the sixth transistor are of a second polarity.

4. A current-boosting output stage with short-circuit protection as recited in claim 3 wherein a collector of the third transistor is coupled to an input of the fifth current source and wherein a collector of the fourth transistor is coupled to an input of the sixth current source.

5. A current-boosting output stage with short-circuit protection as recited in claim 4 wherein the first polarity is NPN and the second polarity is PNP.

6. A current-boosting output stage with short-circuit protection as recited in claim 5 wherein a collector of the fifth transistor is coupled to VCC, and wherein a collector of the sixth transistor is coupled to VEE.

7. A current-boosting output stage with short-circuit protection as recited in claim 1 wherein the first transistor is of a first polarity and the second transistor is of a second polarity.

8. A current-boosting output stage with short-circuit protection as recited in claim 7 wherein the first polarity is PNP and the second polarity is NPN.

9. A current-boosting output stage with short-circuit protection as recited in claim 8 wherein an emitter of the first transistor is coupled to the base of the third transistor, the base of the fifth transistor and the fifth current source output.

10. A current-boosting output stage with short-circuit protection as recited in claim 9 wherein a collector of the first transistor is coupled to an input of the third current source.

11. A current-boosting output stage with short-circuit protection as recited in claim 10 wherein an emitter of the second transistor is coupled to the base of the fourth transistor, the base of the sixth transistor, and the sixth current source output.

12. A current-boosting output stage with short-circuit protection as recited in claim 11 wherein an input of the third current source and an input of the sixth current source are coupled to VEE.

13. A current-boosting output stage with short-circuit protection as recited in claim 12 wherein an input of the fourth current source and an input of the fifth current source is coupled to VCC.

14. A current-boosting output stage with short-circuit protection as recited in claim 13 wherein the first current source and the second current source are fixed current sources.

15. A current-boosting output stage with short-circuit protection as recited in claim 14 wherein the third current source, the fourth current source, the fifth current source and the sixth current source are variable current sources.

16. A current-boosting output stage with short-circuit protection as recited in claim 15 wherein the third current source and the fourth current source include a generally linear multiplier function and the fifth current source and the sixth current source include a generally non-linear multiplier function.

\* \* \* \* \*